(12) United States Patent
Clark et al.

(10) Patent No.: US 6,643,200 B2
(45) Date of Patent: *Nov. 4, 2003

(54) SENSE AMPLIFIER HAVING INTEGRATED Y MULTIPLEXOR AND METHOD THEREFOR

(75) Inventors: Lawrence T. Clark, Phoenix, AZ (US); Robert D. Bateman, Phoenix, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/543,131

(22) Filed: Apr. 5, 2000

(65) Prior Publication Data
US 2002/0145928 A1 Oct. 10, 2002

(51) Int. Cl.[7] .................................................. G11C 7/00
(52) U.S. Cl. ........................ 365/205; 365/207; 365/226
(58) Field of Search ................................. 365/205, 207, 365/208, 233.02, 189.02, 226

(56) References Cited

U.S. PATENT DOCUMENTS

| | | | | |
|---|---|---|---|---|
| 5,276,650 A | * | 1/1994 | Kubota | 365/207 |
| 5,487,048 A | * | 1/1996 | McClure | 365/207 |
| 6,034,885 A | * | 3/2000 | Chan | 365/207 |
| 6,064,612 A | * | 5/2000 | Agata | 365/207 |

* cited by examiner

Primary Examiner—Vu A. Le
(74) Attorney, Agent, or Firm—Kenneth M. Seddon

(57) ABSTRACT

Briefly, in accordance with one embodiment of the invention, an integrated circuit has a sense amp connected to a plurality of bit lines with bit line transistors. Each of the bit line transistors may be connected to a sense amp enable transistor so that together, the coupling and sense amp enable transistors connect the sense amp to a power supply voltage.

22 Claims, 5 Drawing Sheets

SENSE AMPLIFIER HAVING INTEGRATED Y MULTIPLEXOR AND METHOD THEREFOR

This is a continuation of application Ser. No. 09/543,131 filed on Apr. 4, 2000.

BACKGROUND

Conventional memory sense amplifiers (sense amps) may include a set of transistors that each are used to connect one or more bit lines to the sense amp. This may be done by connecting a bit line and the sense amp to the source and drain, respectively, of a connecting "pass" transistor. A dedicated enable signal may then be connected to the gate of each pass transistor to control which of the bit lines is connected to the sense amp. One potential drawback of this configuration may be that while a particular bit line is connected to the sense amp, the sense amp "drives" the bit line through the source and drain of the transistor. Due to the amount of capacitance that may be associated with a particular bit line, this may result in significant power consumption through the sense amp.

Additionally, conventional sense amps may also include a single enable transistor that may be used to enable the entire sense amplifier by connecting the sense amp to a power supply voltage, typically ground. By timing when the individual bit lines are connected to the sense amp with respect to when the sense amp enable transistor connects the sense amp to ground, the power consumption due to the driving of a bit line by the sense amplifier, as discussed above, may be reduced. However, this power savings typically comes with the expense, complexity, and power consumption associated with the additional control logic that performs this timing. In addition, such timing circuits may impose the limitation that the bit line enable signals be provided before the sense amp enable transistor is activated. This limitation may undesirably complicate the design of the sense amp and impose difficult timing restrictions on the operation of the circuit.

Thus, there is a continuing need for better ways to improve the power consumption and operation of sense amps.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
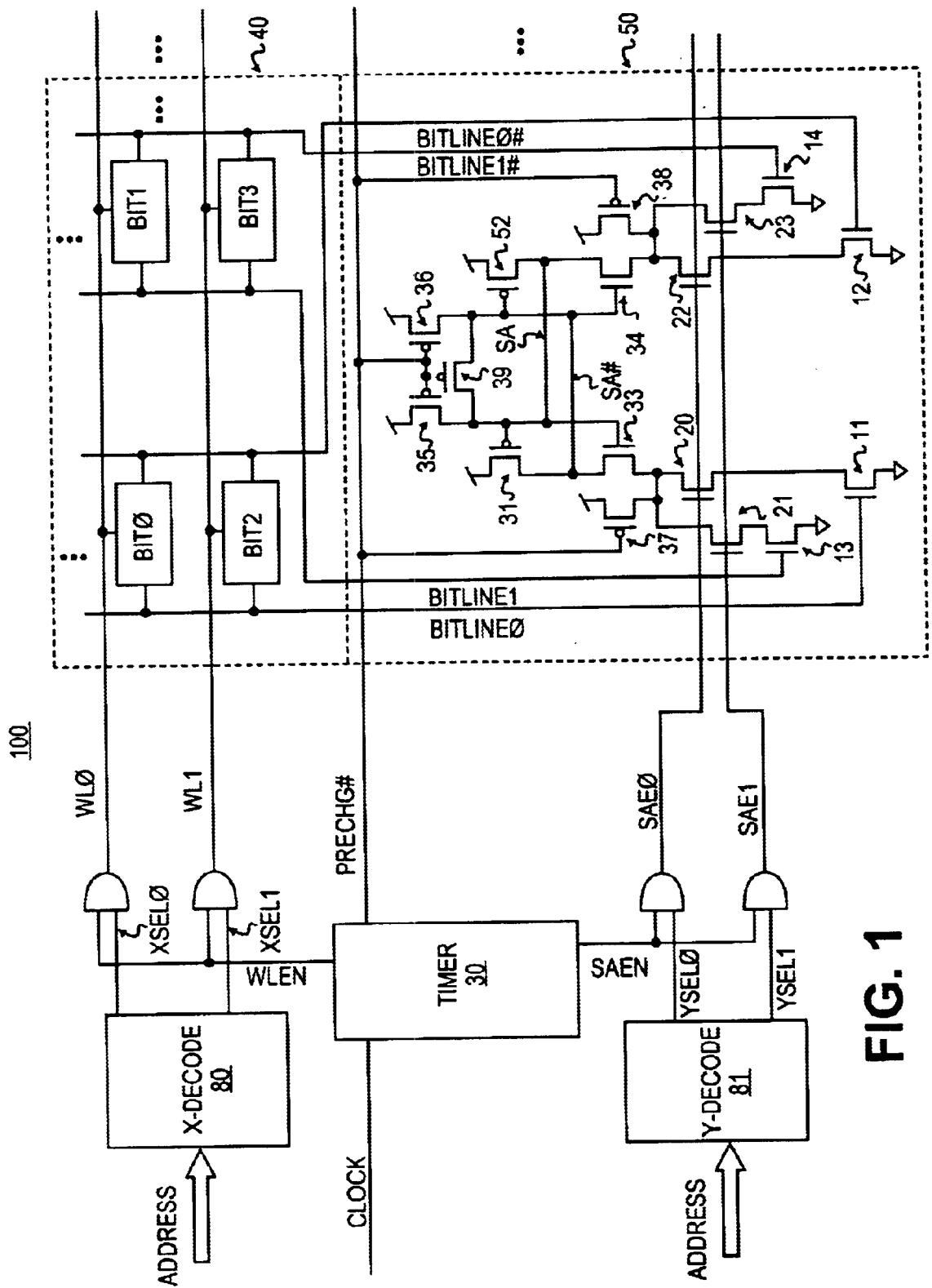
FIG. 1 is a schematic representation of a sense amp in accordance with an embodiment the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description which follow are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

In the following description of the present invention, the terms "connected" and "coupled," along with their derivatives, may be used. It should be understood that these terms are not meant to be limited to having identical meanings. Rather, the two terms may have different meaning and scope. For example, if two elements or components are "connected" together, it may mean the two elements are in direct contact (e.g., electrically, physically, etc.).

In contrast, "coupled" may be broader in that it not only includes elements that are electrically linked together, but may also include alternatives where two or more elements are not in direct contact. In such embodiments the two or more elements may have an interactive relationship with each other (e.g., an optical, electrical, thermo-mechanical, physical, relationship, etc.). Furthermore, it should be understood that these terms are not meant to be used in a manner that is inconsistent with their use by those skilled in the art.

Turning to FIG. 1, an embodiment 100 in accordance with the present invention is described. Embodiment 100 may be an integrated circuit that may be part of a portable device, such as a personal computer, mobile communication device (e.g., cell phone), a portable computing device, or the like. Although it should be understood that the scope of the present invention is in no way limited to these particular applications.

Embodiment 100 includes an integrated circuit 10 that may comprise, for example, a memory device (such as a cache or dynamic random access memory, for example), a microprocessor, a digital signal processor, a microcontroller, or the like. However, it should be understood that the scope of the present invention is not limited to these examples. Integrated circuit 10 may include a sense amp 50 that may be used to read the logic value of individual memory bits of a memory array 40. As shown in FIG. 1, memory array 40 comprises four bit cells (labeled BIT0–BIT3). It should be understood that the scope and applicability of the present invention is not limited to either the size or type of memory array used in conjunction with sense amp 50. Memory array 40 may comprise a static random access memory (SRAM), dynamic random access memory (DRAM), a cache, or the like, as well as any combination thereof. Furthermore, memory array 40 may comprise an array of non-volatile memory cells such as electrically erasable read only memory (EEPROM), flash, or the like, as well as any combination thereof. It should also be understood that only four bit cells are shown in FIG. 1. This is not a limitation upon the scope of the present invention as the number of bit cells may be increased using replication techniques well known in the art.

Figure 2:
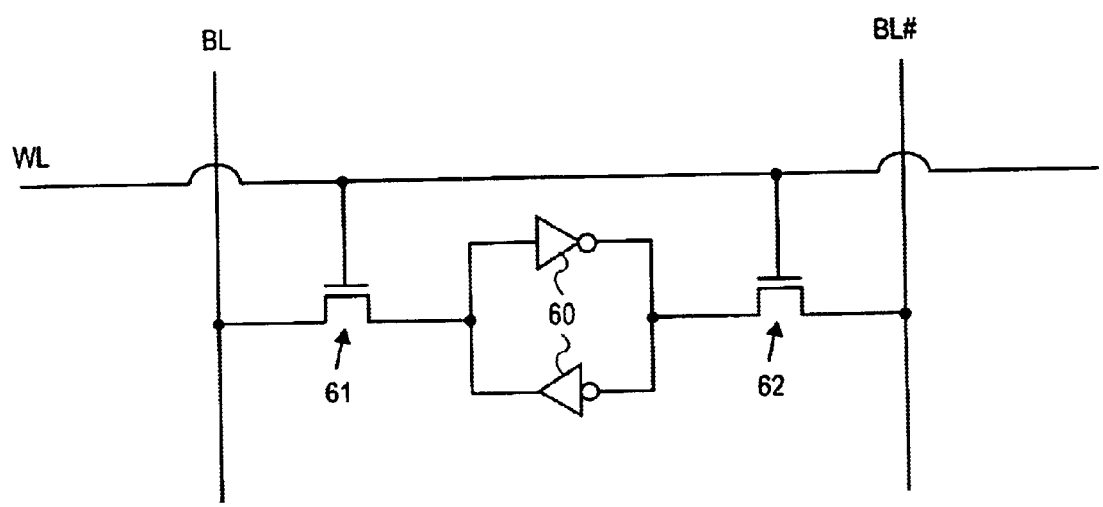
FIG. 2 is a schematic representation of a bit cell that may be used in accordance with the present invention.

Turning briefly to FIG. 2, an example of how a bit cell may be implemented in accordance with an embodiment of the present invention is provided. Although the scope of the present invention is not limited to this implementation, a bit cell may comprise two inverters 60 that are arranged in a feedback loop to maintain the stored logic value of each bit cell. A word line signal (labeled WL) may be used to enable transistors 61–62 so that inverters 60 are connected to the bit lines (labeled BL and BL#). Note, in this description a "#" symbol is used to indicate the logical complement of a signal. For example, if BL is a logic "1," then BL# is a logic "0," although this invention is not limited to any particular signaling scheme.

Referring to FIG. 1, address signals, indicating the bit cell within memory array 40 to be read, may be provided to an X-decoder 80 and a Y-decoder 81. X-decoder 80 generates signals labeled (XSEL0, XSEL1) that enable, in part, the appropriate bit cell (BIT0–BIT3) within memory array 40. The word line signals WL0 and WL1 generated by X-decoder 80 may be gated with a word line enable signal (labeled WLEN) that may be generated by a timer 30. The word line enable signal may be used to provide X-decoder 80 with enough time so that it may decode the logical value of the address signal so that the desired bit cell within memory array 40 may be activated.

Y-decoder 81 generates sense amp Y multiplexor select signals (YSEL0 and YSEL1) that enable, in part, the operation of sense amp 50. Y multiplexor (mux) select signals YSEL0 and YSEL1 may be gated with a sense amp enable signal (labeled SAEN) to provide sense amp enable signals (labeled SAE0 and SAE1). SAE0 and SAE1 may be used to control the timing and operation of sense amp 50 by selecting the bit lines to be compared by sense amp 50. Thus, timer 30 may be used to control the activation of the bit cells and the operation of sense amp 50 so that the power consumption of integrated circuit 10 may be improved. Although not intended as a limitation upon the scope of the present invention, in this particular embodiment, each pair of bit line transistors (e.g., transistors 11–12 and 13–14) may be connected to its own sense amp enable transistor (e.g., sense amp enable transistors 20, 22 and 21, 23, respectively). The inclusion of the Y mux operation into the sense amplifier is apparent in the figure and is discussed further below.

As shown in FIG. 1, a bit line (e.g., BITLINE0 and BITLINE1), and its logical complement may be connected to the gate terminal of transistors 11–14. The drain terminal of transistors 11–14 may be connected to sense amp enable transistors 20–23 and the source terminal may be connected to ground. Sense amp enable transistors 20–21 connect sense amp 50 to the appropriate transistors 11–14 so that sense amp 50 may sink current and resolve the state of a selected bit line. As a result, at least in part, of this configuration, embodiments of the present invention may result in reduced power consumption in comparison with alternative approaches since the individual bit lines are coupled to sense amplifier 50 via the gates of transistors 11–14. Thus, in this particular embodiment, sense amp 50 does not directly drive each of the bit line signals.

Furthermore, embodiments of the present invention may also result in additional power savings, improved circuit complexity, and reduced circuit area, since this particular embodiment without distinct Y mux select signals and reduces the associated complexity of Y mux timing requirements. It should be understood that while the diagrams show two bit line pairs connected to sense amplifier 50, more may be possible as desired and this should not be viewed as limiting upon the scope of the present invention.

In operation, transistor pairs 11 and 12, or 13 and 14, may have different voltage levels applied to them via corresponding bit line signals. These signals may not be at the full voltage rails (e.g., one signal represented by $V_{dd}$ and the other signal by ground). Instead, the bit line and its logical complement may be separated by as little as a few millivolts. Nonetheless, it may be desirable that sense amp 50 be able to quickly determine the logic value of a bit line to reduce the amount of time and power it takes to read the bit cell. This may be achieved as explained below.

In this embodiment, the process of reading a bit cell begins by precharging the bit lines. For example, charging a bit line is charged so that its voltage level may be approximately equal to $V_{dd}$ so that the nodes on the drains of transistors 11–14 are, therefore, at ground. When one of the SAE signals (e.g., SAE0 OR SAE1) is driven to a high logic value, the drain of the corresponding bit line pair transistors 11–12 or 13–14 is pulled high via the sense amplifier enable transistors 20, 22 or 21, 23. When this occurs, the different gate voltages on the bit line transistor pairs may create a current imbalance between the sense amplifier latch nodes SA and SA# via transistors 33 and 34. This current imbalances the latch and sense amp 50 may resolve the corresponding logic values of the bit line.

It may be desirable to utilize precharge transistors 35 and 36 to preset latch nodes SA and SA# to $V_{dd}$ while no SAE signal is asserted. It may also be desirable to substantially equalize the common nodes of sense amp 50 with precharge transistor 39 so that both sides of sense amp 50 are at approximately the same voltage potential. This may be useful if sense amplifier 50 is enabled before both latch nodes SA and SA# reach $V_{dd}$ during the precharge phase. Additionally, precharge transistors 37 and 38 may be used to precharge the common nodes at the drains of transistors 20–21 and 22–23. While these nodes may precharge to $V_{dd}$-$V_{tn}$ via transistors 33 and 34, these additional precharge devices may put these nodes substantially at $V_{dd}$, thereby improving the speed of sense amplifier 50.

The location of sense amplifier enable transistors 20–23 above input transistors 11–14 isolates the common nodes of sense amplifier 50 from the load of the input transistors 11–14 that are not enabled. For example, if SAE0 is asserted (e.g., logic high), input transistors 11 and 12 are connected to sense amp 50, while the extra capacitance of transistors 13 and 14 is not connected to sense amplifier 50. Consequently, embodiments of the present invention may, thereby reduce power consumption by reducing the amount of capacitance that is connected to sense amp 50 while it is in operation.

Embodiments of the present invention may also address the timing restrictions that are imposed by some previously known sense amp configurations. For example, in this particular embodiment of the present invention, the sequence for reading a bit cell may begin by generating the proper bit line and word line enable signals with X-decoder 80 and Y-decoder 81. Timer 30 may then generate the word line enable signal so that the desired bit cells may provide their value onto the appropriate bit lines. The voltage level stored in a bit cell enables the appropriate bit line transistors 11–14. Timer 30 may then generate the sense amp enable signals after memory array 40 has had time to provide the proper logic values on to the bit lines. By activating one pair of sense amp transistors 20, 22 or 21, 23, sense amp 50 may be provided a current path that allows sense amp 50 to determine whether the bit line, or its complement, is at the greater voltage level.

Figure 3:
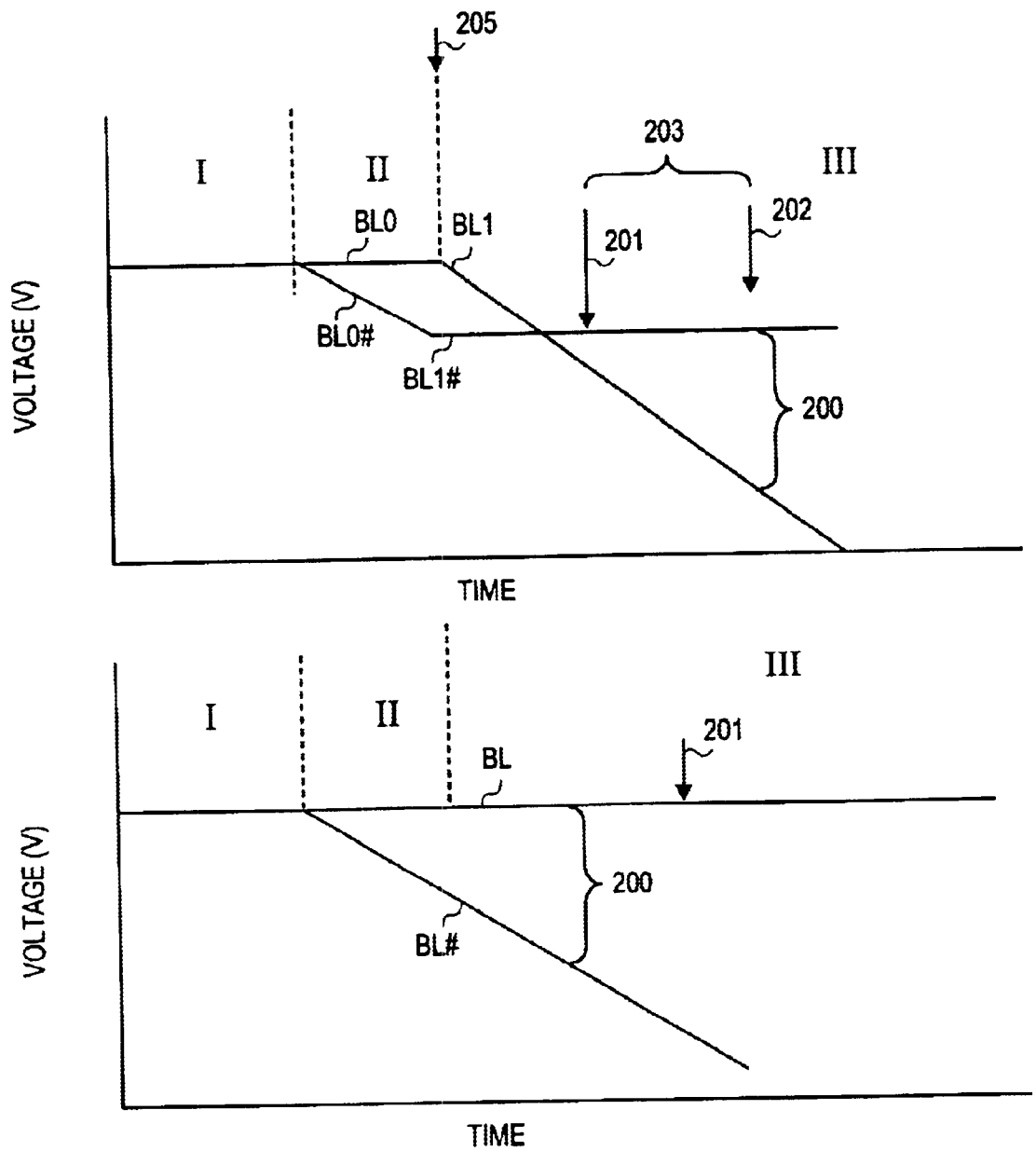
FIG. 3 is a graph demonstrating some of the advantages that may be appreciated with embodiments of the present invention.

Thus, in embodiments of the present invention, the sense amp enable signal does not have to be generated prior to activation of the word line enable signals. Consequently, it may be possible for Y-decoder 80 to change states or provide the bit line enable signals after the word line enable signals are generated. Consequently, sense amp 50 may maintain substantially full signal margin during read operations. This may be beneficial if sense amp 50 begins reading a first bit cell, but then the Y-multiplexor is changed so that sense amp 50 has to read a second bit cell that contains the opposite logical value. FIG. 3 is provided to demonstrate how an integrated circuit in accordance with embodiments of the present invention may maintain substantially full signal range and permit the Y-decoder to change values (e.g., change the Y mux bit lines selected). This benefit is contrasted in FIG. 3 with the detrimental effect the change might have on a conventional sense amp.

FIG. 3 includes a graph illustrating the operation of a conventional sense amp (upper diagram) plotted against the operation of a sense amp in accordance with the present invention (lower diagram). In this illustration, a read operation may begin by precharging the bit lines, labeled in FIG. 3 as region I. During time region II of the upper diagram, the bit cells are enabled to begin the read process. Accordingly, the voltage on one side of the sense amp, (BL0# in this example), begins to drop indicating that side is at a low voltage logic level (e.g., the bit cell being read contains a high voltage level on BL0).

Once the word line WL(N) is asserted, the sense amp is given sufficient time to allow one side of the sense amp to change with respect to the other side so that there is a sufficient voltage differential between the two sides of the sense amp. The amount of time it takes for a memory array to create enough of a voltage differential between the bit line pairs may vary depending on many factors, such as the size of the transistors or the size of the memory array. A bracket 200 is used in FIG. 3 to indicate the amount of voltage differential desired before the sense amp may reliably read a bit cell. Generally, this voltage must be sufficient to allow a worst-case, mis-matched sense amplifier to properly resolve the logic value stored in the memory cell.

However, as shown in the upper diagram, if the Y-multiplexor data has changed before the operation is complete (the occurrence of which is indicated in the upper graph with an arrow 205), the signal to a conventional sense amp may be potentially subtracted during this time, ie, the sense amp may stop reading the old bit cell (e.g., Bit cell 0) and begin reading another bit cell (e.g., bit cell 1). Since the sense amp was not precharged after the Y-multiplexor selected another bit cell to read, the high side of the sense amp discharges to provide enough of a voltage differential between the BL1 and BL1# lines to overcome the voltage drop due to the initial read of the original bit cell. Therefore, the sense amp is delayed due to the time spent reading the original bit cell in region II of the graph.

In contrast, the embodiment of the present invention illustrated in the lower diagram addresses the situation of the voltage subtraction effect due to a change in the Y-multiplexor data. As explained above, timer 30 (see FIG. 1) may generate the sense amp enable signal (SAEN) after the word line enable signal (WLEN). Thus, the value generated by Y-decoder 81 may change without substantially affecting the operation of sense amp 50. For example, the Y-decoder data may change as desired during time region II of the lower diagram. Once the appropriate value of the Y-decoder is determined, this value may be provided to the sense amp, labeled in FIG. 3 as region II. Since there was substantially no voltage loss due to prior changes, the sense amp may reliably read the bit cell after a sufficient voltage differential exists between the two sides of the sense amp (indicated with an arrow 201). As indicated in FIG. 3 with a bracket 203, a sense amp in accordance with embodiments of the present invention may be able to read a bit cell sooner than a conventional sense amp circuit. Because a sense amp in accordance with embodiments of the present invention has addressed the problems associated with interrupted reads, the sense amp may maintain substantially full signal range and read a bit cell faster than conventional sense amps. Additionally, since the sense amp nodes do not load the bit lines, the signal development on BITLINE and BITLINE# may develop in less time.

Figure 4:
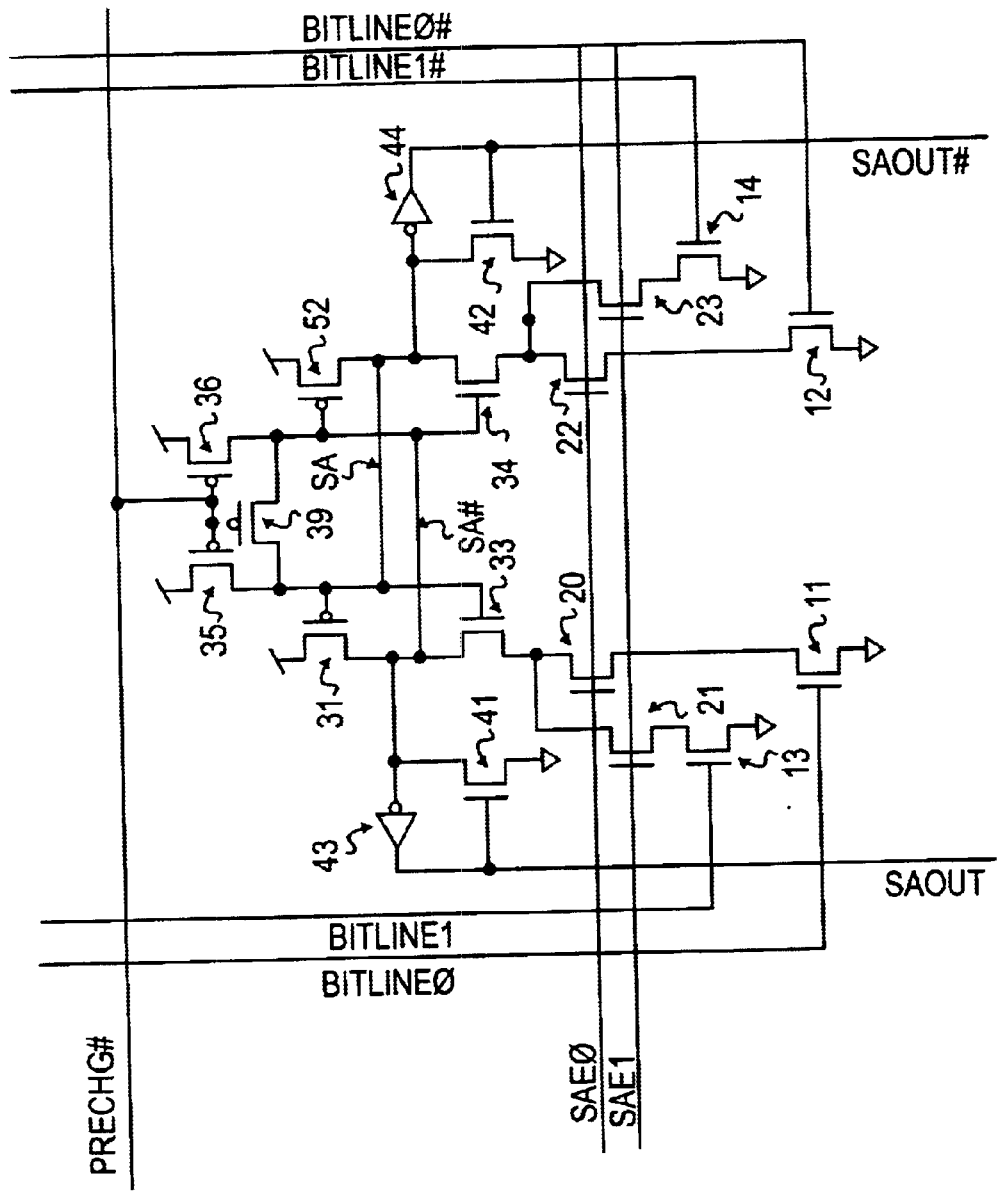
FIG. 4 is a schematic representation of a sense amp in accordance with an alternative embodiment of the present invention.

FIG. 4 illustrates a sense amp in accordance with an alternative embodiment of the present invention. As shown, sense amp 50 includes additional pull-down devices which may be optionally added to increase the speed of sense amp 50. The addition of the feedback transistors 41 and 42 controlled by the output buffer inverters 43 and 44 may afford greater pull-down speed without appreciably affecting the circuit matching and operation of sense amp 50.

Figure 5:
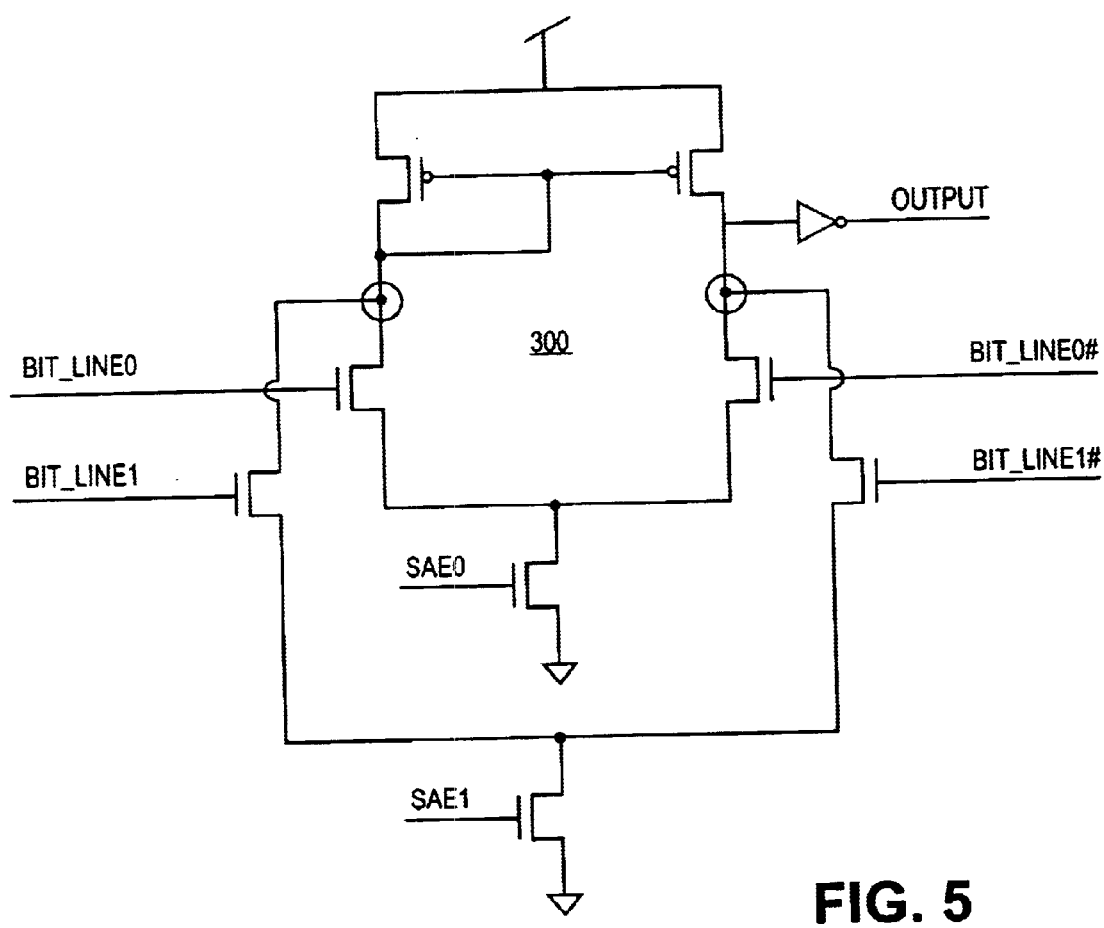
FIG. 5 is a schematic representation of a sense amp in accordance with yet another alternative embodiment of the present invention.

FIG. 5 is provided to illustrate an alternative embodiment of a sense amp 300 in accordance with the present invention. FIG. 5 demonstrates that the scope of the present invention is not limited by the particular configuration of the sense amp that is used to read the bit cells. In this particular configuration, sense amp 300 may return to its "precharge" condition should sense amp 300 be disabled during a read operation.

By now it should be appreciated that the present invention provides embodiments including a sense amp circuit that may be used to read the value stored in bit cells. These sense amp configurations may consume less power than conventional sense amp circuits because they address the need to have control logic that is used to connect and disconnect the bit lines from the sense amp. The embodiments of the present invention also reduce the timing complexity associated with sequencing when the sense amp is enabled with respect to connecting the sense amp to the bit lines. In addition, embodiments of the present invention also provide flexibility in that the sense amp enable signals may be generated before or after the word lines are enabled. This may allow the Y-Multiplexor data to change without substantially affecting the operation of the sense amp.

While certain features of the invention have been illustrated and described herein, many modifications, substitutions, changes, and equivalents will now occur to those skilled in the art. For example, the number of bit cells connected to a sense amp, or the number of sense amps in a circuit may be changed as desired. It is, therefore, to be understood that the appended claims are intended to cover all such modifications and changes as fall within the true spirit of the invention.

What is claimed is:

1. An apparatus having an integrated circuit, the integrated circuit comprising:
   a sense amp having a first transistor having a gate terminal coupled to a first bit line and a second transistor having a gate terminal coupled to a second bit line;
   a first enable transistor coupled to the sense amp and further coupled to a drain of the first transistor; and a second enable transistor coupled to the sense amp and further coupled to a drain of the second transistor.

2. The apparatus of claim 1, wherein the first enable transistor has a gate terminal coupled to an enable signal, and wherein the first enable transistor is adapted to couple the sense amp to a power supply.

3. The apparatus of claim 2, and further comprising a Y decoder that is adapted to select one of the first bit line and the second bit line, wherein the Y decoder provides a select signal, the gate of the first enable transistor being coupled to the select signal.

4. The apparatus of claim 2, and further comprising a precharge transistor coupled to the drain terminal of the first enable transistor.

5. The apparatus of claim 1, and further comprising a third transistor having a drain terminal coupled to the sense amp and a gate terminal that is coupled to a third bit line, wherein the third bit line represents the logical complement of the first bit line.

6. An apparatus comprising:
   a static random access memory;
   a processor coupled to the static random access memory;
   a first bit line;
   a second bit line;
   a sense amp:
      a first sense amp enable transistor coupled to the sense amp and the first bit line, wherein the sense amp enable transistor is adapted to couple the sense amp to a ground voltage potential; and
      a second sense amp enable transistor coupled to the sense amp and the second bit line.

7. The apparatus of claim 6, wherein the first sense amp enable transistor comprises a gate terminal adapted to receive a first sense amp enable signal.

8. The apparatus of claim 7, wherein the second sense amp enable transistor comprises a gate terminal adapted to receive a second sense amp enable signal.

9. The apparatus of claim 6, and further comprising a first bit line transistor coupled to the sense amp, wherein the first bit line transistor has a gate terminal coupled to the first bit line.

10. The apparatus of claim 9, wherein the first bit line transistor has a drain terminal and the first sense amp enable transistor has a source terminal, the drain terminal of the first bit line transistor being coupled to the source of the first sense amp transistor.

11. The apparatus of claim 10, wherein a source terminal of first bit line transistor is connected to a power supply voltage.

12. The apparatus of claim 9, and further comprising a second bit line transistor coupled to the sense amp, wherein the second bit line transistor has a gate terminal coupled to the second bit line.

13. The apparatus of claim 6, and further comprising a timer adapted to generate a word line signal and a sense amp enable signal, wherein the timer is adapted to generate the sense amp enable signal after the word line signal.

14. The apparatus of claim 13, wherein the word line signal signals a first bit cell and a second bit cell to place data on the first bit line and the second bit line, and the sense amp enable signal enables one of the first sense amp enable transistor and the second sense amp enable transistor.

15. The apparatus of claim 13, where in the sense amp is adapted to maintain substantially full signal range.

16. A method of sensing data with a sense amp, the method comprising:
   enabling a first bit line transistor with a first bit line;
   enabling a second bit line transistor with a second bit line; and
   generating an enable signal that enables one of a plurality of sense amp enable transistors and couples the first bit line transistor to a ground voltage potential.

17. The method of claim 16, wherein enabling the first bit line transistor includes coupling a gate terminal of the first bit line transistor to the first bit line.

18. The method of claim 17, wherein generating the enable signal includes coupling the enable signal to a gate terminal of one of the plurality of sense amp enable transistors so that the sense amp is coupled to a power supply voltage through the first bit line transistor.

19. The method of claim 16, wherein generating the enable signal includes decoding an address.

20. The method of claim 19, wherein decoding the address includes decoding the address with a Y-decoder.

21. The method of claim 19, wherein decoding the address includes decoding the address provided from a cache memory.

22. An apparatus comprising a timer adapted to generate a word line signal and a sense amp enable signal, wherein the word line signal activates a first bit line and a second bit line, and the sense amp enable signal enables one of a first sense amp enable transistor and a second sense amp enable transistor.

* * * * *

UNITED STATES PATENT AND TRADEMARK OFFICE
CERTIFICATE OF CORRECTION

PATENT NO. : 6,643,200 B2  Page 1 of 1
DATED : November 4, 2003
INVENTOR(S) : Clark et al.

It is certified that error appears in the above-identified patent and that said Letters Patent is hereby corrected as shown below:

<u>Column 6,</u>
Line 5, delete "II", insert -- III --.

Signed and Sealed this

Ninth Day of March, 2004

JON W. DUDAS
*Acting Director of the United States Patent and Trademark Office*